United States Patent [19]

Yamazaki

[11] Patent Number: 4,816,113
[45] Date of Patent: Mar. 28, 1989

[54] METHOD OF ELIMINATING UNDESIRABLE CARBON PRODUCT DEPOSITED ON THE INSIDE OF A REACTION CHAMBER

[75] Inventor: Shunpei Yamazaki, Tokyo, Japan

[73] Assignee: Semiconductor Energy Laboratory Co., Ltd., Kanagawa, Japan

[21] Appl. No.: 159,856

[22] Filed: Feb. 24, 1988

[30] Foreign Application Priority Data

Feb. 24, 1987 [JP] Japan ................. 62-041749

[51] Int. Cl.⁴ .................. B44C 1/22; C03C 15/00; C03C 25/06
[52] U.S. Cl. .................. 156/643; 118/728; 118/50.1; 118/623; 134/1; 156/646; 156/345; 427/38; 427/45.1; 427/47; 427/122; 204/192.3; 204/192.35; 204/298

[58] Field of Search ............. 134/1; 156/643, 646, 156/345; 427/38, 39, 45.1, 47, 122; 204/192.15, 192.3, 192.32, 192.35, 298; 118/728, 50.1, 620, 623

[56] References Cited

U.S. PATENT DOCUMENTS

| | | | |
|---|---|---|---|
| 4,138,306 | 2/1979 | Niwa | 156/345 |
| 4,529,474 | 7/1985 | Fujiyama et al. | 156/643 |
| 4,576,698 | 3/1986 | Gallagher | 204/192 |
| 4,620,898 | 11/1986 | Banks | 156/643 |

Primary Examiner—William A. Powell
Attorney, Agent, or Firm—Gerald J. Ferguson, Jr.

[57] ABSTRACT

The inside of a reaction chamber for CVD is cleaned after deposition of a carbon film. When crystalline carbon or diamond-like carbon is formed in the chamber, undesirable deposition occurs on the inside of the reaction chamber. The sticky carbon deposition is removed by etching, making use of oxygen or oxygen compound gas rather than fluorine or chlorine compound gas which tends to damage the inside of the reaction chamber.

13 Claims, 4 Drawing Sheets

4,816,113

METHOD OF ELIMINATING UNDESIRABLE CARBON PRODUCT DEPOSITED ON THE INSIDE OF A REACTION CHAMBER

BACKGROUND OF THE INVENTION

This invention relates to a method of eliminating undesirable deposition from the inside of a reaction chamber for CVD.

Recently, we have proposed a new method for depositing carbon films on substrates by applying a microwave and a magnetic field to a carbon compound gas in a vacuum chamber. The chemical vapor reaction causes necessarily undesirable deposition on the inside of the reaction reaction chamber.

It has been known as a removing technique to subject the carbon film to etching, particularly, to etch an amorphous film by means of Electron Cyclotron Resonance (ECR). In the prior art, active particles such as derived from a fluorine compound gas or chlorine compound gas are produced by ECR at a suffcienctly low pressure where at least electrons can make respective circular paths, and drifted to a substrate disposed apart form the resonating space by virtue of a divergent magnetic field.

However, in such a prior art, the wear of the apparatus is accelerated because of the use of fluorine compound or chlorine compound as an etchant gas, in particular the exhaustion oil is degraded. For this reason, it is required to remove unnecessary products deposited on the inside of the reaction chamber without making use of a fluorine compound and a chlorine compound to clean the reaction chamber after taking out the substrate coated with a film composed mainly of carbon or its compound(s) from the chamber, so that the inside wall of the reaction chamber is not damaged by errosion.

SUMMARY OF THE INVENTION

It is therefore an object of the invention to clean a CVD apparatus by removing undesirable products by etching without damaging the inside of the CVD apparatus.

In order to accomplish the above and other objects, etching is implemented by making use of oxygen and/or oxygen compound gas (NO, $NO_2$, $N_2O$, and $H_2O$ and the like) as the gas etchant which does not cause damage to the inside of the chamber. Preferably, the strength of the magnetic field in the reaction chamber is varied in order to shift the position where the electric field of microwave takes its maximum value in correspondence with an ECR condition and where the exciting condition of oxygen in the vicinity is maintained. By virtue of the varying magnetic field, high energy plasma can move along the entire inside surface and eliminate undesirable carbon deposited thereon.

DETAILED DESCRIPTION OF THE PREFERRED EMBODIMENTS

Figure 1:
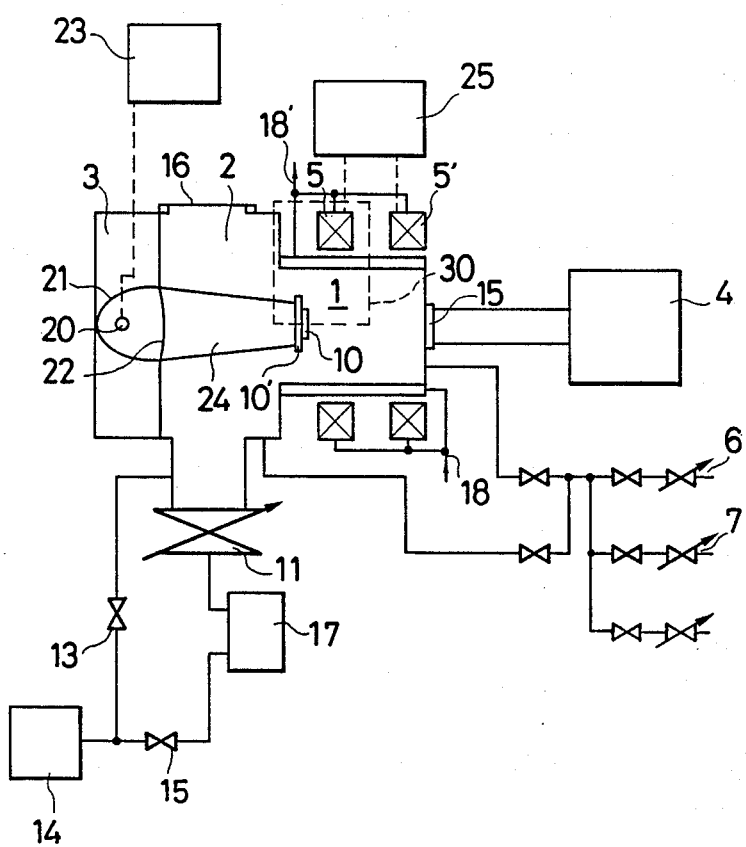
FIG. 1 is a cross section view showing a CVD apparatus for carrying out etching in accordance with the present invention.

In advance of describing the etching process in accordance with the present invention, carbon deposition process will be briefly illustrated. A substrate to be coated with a carbon film is disposed in the reaction chamber of a CVD apparatus, and heated to 600°-1000° C., e.g., 850° C. in a vacuum. Hydrogen gas is inputted to the reaction chamber whereas the pressure of the chamber is gradually elevated to 0.1 to 300 Torr. Further, carbon compound gas such as methane, ethylene and acetylene is introduced at such a flow rate that the proportion of carbon compound becomes 0.1-5% in the mixture of hydrogen and carbon compound, e.g., at methane/hydrogen = 1.5%. Then, a microwave and a magnetic field are applied to the reactive gas. By virtue of the electromagnetic power, hydrogen plasma is produced at such a high density $10^2$–$10^5$ times as high as that obtained in a prior art ECR CVD. In the highly dense plase, amorphous carbon is selectively removed so that crystalline carbon (mainly of diamond) remains. Such a high density of hydrogen plasma have been available only at that comparatively high pressure. In the high pressure condition, Mixed Cyclotron Resonance (MCR) takes place rather than ECR. The MCR is a new type of resonance which appears together with the whistler mode.

After completing the formation of carbon film, the microwave input and the application of magnetic field are ended and the pressure of the chamber is returned to the atmospheric pressure by introducing air into the chamber followed by cooling. Then, the substrate, on which an i-carbon (the mixture of diamond and amorphous carbon) layer or a crystalline layer composed of diamond powder, is removed from chamber, and the substrate holder is disposed in the chamber again. The chamber is exhaused again, into which oxygen ($O_2$) is introduced. By virtue of the associated action between a microwave and a magnetic field, active oxygen is created which eliminates, by etching, undesirable products deposited on the inside wall of the reaction chamber during the formation of the i-carbon or diamond on the substrate. The pressure of the chamber is maintained at 1.0 to 10 Torr.

As an option, when a highly dense plasma is generated by means of the associated action of a microwave and a magnetic field, the plasma may be irradiated with a high energy light such as an ultraviolet light to impart a continueing energy to the etchant gas. In this case, there can exist highly exciting hydrogen also in a position 1-50 cm distant from the highly dense plasma generating region where the electric field microwave can be its maximum strength, and therefore it become possible to remove carbon deposition by etching broadly in the chamber.

In the etching process according to the present invention, oxygen or oxygen compound gas is employed as the etchant gas rather than fluorine or chlorine compound gas, and therefore the etching process causes no damage to the inside of the reaction chamber and the substrate holder. Undesirable carbon can be removed in the gaseous form of carbon dioxide. As a result, it is not necessary to make use of wet etching to eliminate hard carbon sticking on the inside of the chamber.

Hereinbelow, the process in accordance with the present invention is explained in conjunction with the accompanied drawings. In FIG. 1, a microwave enhanced plasma CVD apparatus in accordance with the present invention is illustrated. In the figure, the apparatus comprises a reaction chamber in which a plasma generating space 1 and an auxliary space 2 are defined and can be maintained at an appropriate negative pressure, a microwave generator 4, electro-magnets 5 and 5' in the form of helmholtz coils surrounding the space 1, a power supply 25 for supplying an electric power to the electro-magnets 5 and 5', and a water cooling system 18. The plasma generating space 1 has a circular cross section. In the plasma generating space 1 has a substrate holder 10' made of a material which less disturbs the condition of magnetic field created by the magnets 5 and 5' in the chamber, e.g., made of alminium nitride is provided on which a substrate 10 is mounted. The substrate holder 10' is irradiated and heated to 600°–1000° C., e.g., 800° C. in the atmosphere of a high temperature plasma gas with an infrared light 24, which is emitted from an IR heater 20, reflected from an IR reflection parabola mirror 21 and focused on the back surface of the holder 10' through a lens 22. A reference numeral 23 designates a power supply for the IR heater 20. Provided for evacuating the reaction chamber is an evacuating system comprising a turbo molecular pump 17 and a rotary pump 14 which are connected with the reaction chamber through pressure controlling valves 11, 13 and 15. The substrate temperature may reach to a sufficient level only in virtue of the plasma gas generated in the reaction chamber. In the case, the heater can be dispensed with. Further, depending on the condition of the plasma, the substrate temperature might elevate too high to undergo a suitable reaction. In the case, cooling means has to be provided. The process with this apparatus is carried out as follows.

A substrate 10 is mounted on the substrate holder 10', and the reaction chamber is evacuated to $1 \times 10^{-6}$ Torr or a higher vacuum condition. Then, hydrogen gas is introduced from a gas introducing system 6 at 100 SCCM. In addition to the introduction of the hydrogen gas, a cabon compound gas as the productive gas such as $C_2H_2$, $C_2H_4$, $CH_3OH$, $C_2H_5OH$ or $CH_4$ are inputted at 1.5 SCCM through an introduction system 7. A microwave of 500 Watt at 2.45 GHz is emitted from the microwave generator 4 thorugh a microwave introduction window 15 to the plasma generating space 1 which is subjected to an magnetic field of about 2K Gauss induced by the magnets 5 and 5'. The reactive gas is excited into a high density plasma state in the space 1. By making high the pressure of reactive gas at the space 1 to 0.1–300 Torr, preferably 3 to 300 Torr, e.g., 10 Torr, the density of hydrogen radicals and the growth rate of diamond are made high.

Next, heating the substrate 10, the introduction of microwave and magnetic field are stopped, and the substrate 10 is removed from the reaction chamber. With the substrate holder 10' put back in the reaction chamber, the inside of the chamber is heated to 500°–1000° C. and oxygen is inputted thereto. Keeping the pressure in the chamber at 0.1 to 10 Torr, a microwave and a magnetic field are inputted in the same way as discussed above for deposition. Then, undesirable carbon deposition is eliminated from the inside of the chamber.

Figure 2A:
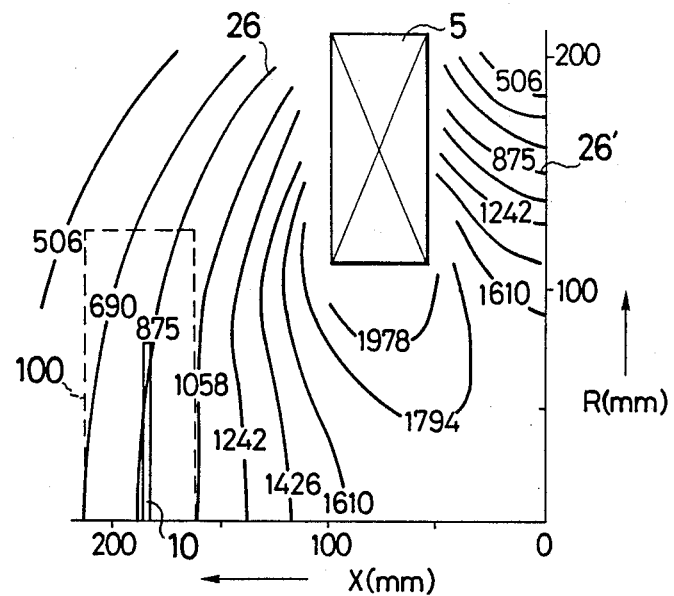
FIG. 2(A) is a graphical diagram showing the plofile of the equipotential surfaces of magnetic field in cross section in accordance with a computor simulation.
Figure 2B:
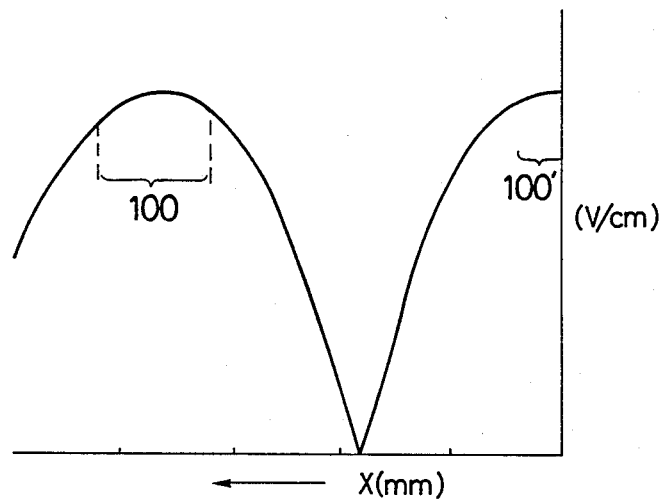
FIG. 2(B) is a graphical diagram showing the strength of electric field in accordance with a computor simulation.

FIG. 2(A) is a graphical diagram showing the distribution of magnetic field on the region 30 in FIG. 1. Curves on the diagram are plotted along equipotential surfaces and given numerals indicating the strengths on the respective curves of the magnetic field induced by the magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185 Gauss) and the electric field interact. In the diagram, a reference 26 designates the equipotential surface of 875 Gauss at which ECR (electron cyclotron resonance) condition between the magnetic field and the frequency of the microwave is sutisfied. Of course, in accordance with the present invention, ECR can not be established due to the high pressure in the reaction chamber, but instead a mixed cyclotron resonance (MCR) takes place in a broad region including the equipotential surface of the ECR condition. The MCR appears together with the whistle mode. FIG. 2(B) is a graphical diagram of which the X-axis corresponds to that of FIG. 2(A) and shows the strength of electric field of the microwave in the plasma generating space 1. The strength of the electric field takes its maximum value in the regions 100 and 100'. However, in the region 100', it is difficult to heat the substrate 10' without disturbing the propagation of the microwave. Also, in the region, the strength of magnetic field becomes disparate so tha rapid etching is accomplished only at the region where the ECR condition is satisfied. In other region. a film can not uniformly undergo etching. It is for this reason that the region 100 is considered to be most suitable place of etching when etching of a substrate is desired.

When the output power of the microwave is 500W, the etching speed is 0.3 micron/min. However, the etching speed can be elevated approximately three times by increasing the power to 1.2 KW. Also the etching speed can be increased by elevating the pressure in the reaction chamber, e.g., within the pressure range from 0.1 Torr to 30 Torr. However, in practice, it becomes difficult to maintain the etchant gas in an appropriate plasma condition at higher than 30 Torr.

Figure 3A:
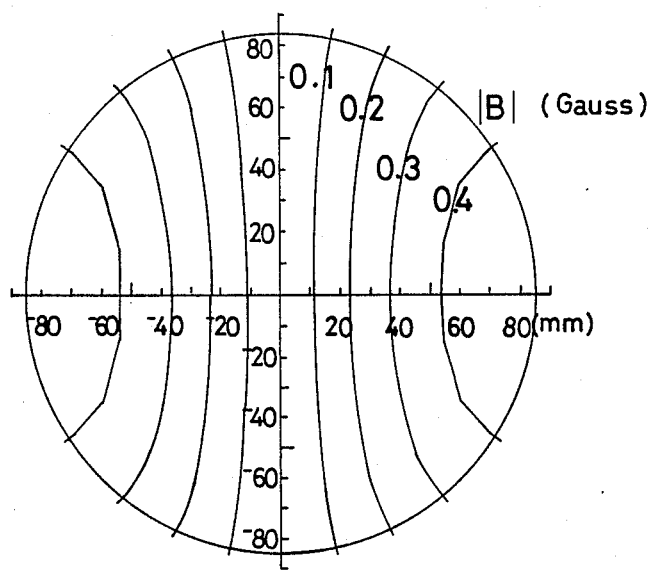
FIGS. 3(A) and 3(B) are graphical diagrams showing equipotential surfaces in terms of magnetic field and electric field of microwave propagating in a resonating space. respectively.
Figure 3B:
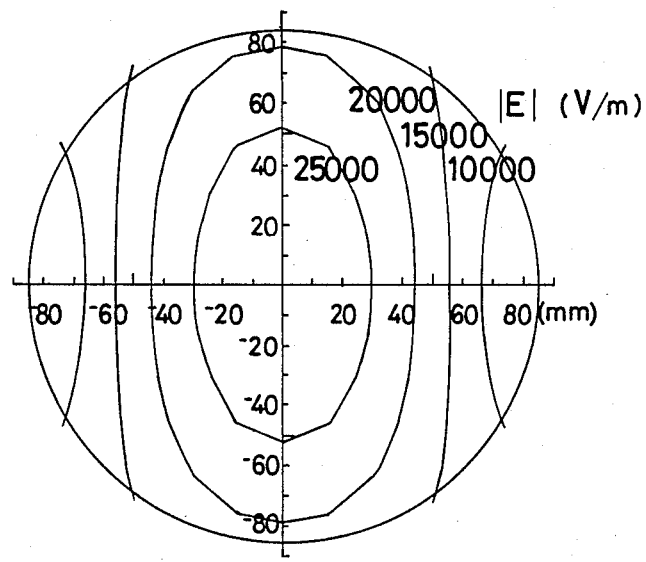

FIGS. 3(A) and 3(B) are graphical diagrams showing the distributions of the magnetic field and the electric field due to microwave emitted from the microwave generator 4 on a cross section of the plasma generating space 1. The curves in the circles of the figures are plotted along equipotential surfaces and given numerals showing the strength. As shown in FIG. 3(B), the electric field reaches its maximum value at 25 KV/m.

Figure 4:
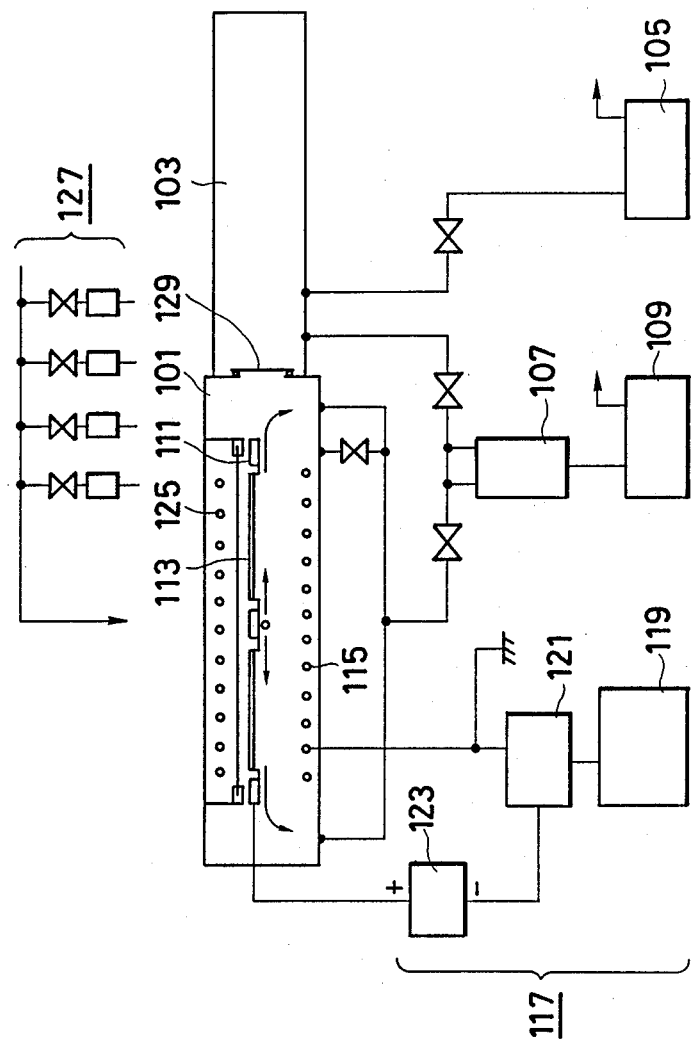
FIG. 4 is a cross section view showing another CVD apparatus for carrying out etching in accordance with the present invention.

The present invention can be applied for etching of carbon by means of glow or arc discharge caused by an r.f. power. FIG. 4 is a cross sectional view showing a CVD apparatus for deposition by virtue of an r.f. power. In the figure, the apparatus comprises a reaction chamber 101, a loading chamber 103, a rotary pump 105 for evacuating the loading chamber 103, a turbo molecular pump 107 associated with a rotary pump 109 for evacuating both the reaction chamber 101 and the loading chamber 103, a gas feeding system 127 for inputting process gas such as reactive gas or dopant gas through a nozzle 129, a substrate holder 111 for supporting objects 113, electrodes 115 disposed opposite to the holer 111, an RF power supply 117 consisting of a radiofrequency power source 119 associated with a matching circuit 121 and a DC bias circuit 123 for supply an r.f. power between the electrodes 11 and the substrate holder 111, and a halogen lamp heater 125 with a quartz window 129 for heating the objects 113. The deposition process for coating the objects 113 with a carbon film is as follow.

After disposing the objects 113 in the reaction chamber 101 through a gate 129, a reactive gas composed of a gaseous carbon compound such as $CH_4$, $C_2H_4$ and $C_2H_2$, and a dopant gas such as nitrogen, a nitrogen compound gas and a boron compound gas if necessary were inputted to the reaction chamber at $1 \times 10^{-3}$ to $5 \times 10^{-1}$ Torr. The carbon compound gas was diluted with hydrogen at 50 mol %. At the same time, the objects 113 were kept at not higher than 450° C. by means of the heater 125. In this condition, a vapor reaction was initiated by means of r.f. power inputted from the power supply 117 The r.f. power was 50W to 1KW (0.03 to 3.00W/cm$^2$) at 13.56 MHz superimposed on an DC bias voltage of $-200V$ to $+400V$. Then, carbon films were deposited on the objects 113 at a growth rate of 150 Å/min. The carbon film looked like an amorphous structure rather than a crystalline structure. Despite the amorphous structure, the hardness was measured as high as that of a diamond film. The Vickers hardness thereof was 2000-6400 Kg/mm$^2$, e.g., 4500 Kg/mm$^2$. So we call it "diamond-like carbon" or DLC for short. After completing the deposition of carbon, oxygen etching is implemented in the same manner as illustrated for the preceding emvbodiment except the use of an r.f. power instead of microwave power.

An etching rate of 350 was established when the RF power is 100W; the pressure was 10 pa in the chamber, the O$_2$ introduction flow rate was 200 SCCM; and the substrate temperature was room temperature. Also an etching rate of 270 was established when the RF power is 100W; the pressure was 5 pa in the chamber, the O$_2$ introduction flow rate was 50 SCCM; and the substrate temperature was room temperature.

As illustrated above, in accordance with the present invention, harmful deposition on surfaces inside the reaction chamber other than the surface to be coated incidentally occuring during carbon coating can be eliminated. Particularly, electric power can be effectively supplied since the electrodes are kept clean before carbon formation. The invention is most usable when carbon formation is repeated many times. In such a case, between each other formations, the reaction chamber is made clean by etching according to the present invention.

In the foregoing description, "carbon" to be deposited in accordance with the present invention includes graphite, diamond, amorphous, or other crystalline or non-crystalline carbon, and the form of the carbon includes a film, a layer, an aggregation, a texture, or other form.

The invention should not limited to the above particular embodiments and many modifications and variations may cause to those skilled in the art.

I claim:

1. An etching method for removing carbon deposition sticking on the inside of the reaction chamber of a deposition apparatus after completing the deposition of a material consisting mainly of carbon on a substrate, said method comprising:

evacuating said reaction chamber;

inputting oxygen or oxygen compound gas as the etchant gas to said reaction chamber; and inputting an electromagnetic power to said reaction chamber to produce a plasma gas derived from said etchant gas.

2. The method of claim 1 wherein said carbon material is diamond.

3. The method of claim 1 wherein said carbon material is DLC.

4. The method of claim 1 wherein said electromagnetic power is microwave.

5. The method of claim 2 wherein said microwave is inputted to said etchant gas while said etchant gas is subjected to a magnetic field.

6. The method of claim 5 wherein the pressure of said etchant gas is 0.1 to 10 Torr.

7. The method of claim 1 wherein said electromagnetic power is an r.f. power.

8. The method of claim 7 wherein the pressure of said etching gas is 0.001 to 0.5 Torr.

9. The method of claim 8 wherein the temperature is chosen between room temperature and 450° C.

10. The method of claim 6 wherein said etching is carried out while the inside of said chamber is irradiated with light.

11. The method of claim 10 wherein said light is an ultraviolet light.

12. The method of claim 3 wherein the inside of said reaction chamber is heated to 500°-1000° C.

13. The method of claim 1 wherein the etching is carried out before another carbon deposition.

* * * * *